United States Patent [19]

England et al.

[11] Patent Number: 6,093,456
[45] Date of Patent: Jul. 25, 2000

[54] BEAM STOP APPARATUS FOR AN ION IMPLANTER

[75] Inventors: Jonathan Gerald England; David R. Burgin; Michael Wauk, all of West Sussex, United Kingdom; Ryoji Todaka, Narita, Japan

[73] Assignee: Applied Materials, Inc., Santa Clara, Calif.

[21] Appl. No.: 08/973,115

[22] PCT Filed: Jun. 7, 1995

[86] PCT No.: PCT/GB95/01309

§ 371 Date: Dec. 5, 1997

§ 102(e) Date: Dec. 5, 1997

[87] PCT Pub. No.: WO96/41364

PCT Pub. Date: Dec. 19, 1996

[51] Int. Cl.⁷ ............................. C23C 14/48; H01J 27/00
[52] U.S. Cl. ................. 427/523; 204/298.04; 250/492.3; 250/432 R; 250/400; 315/111.81
[58] Field of Search ........................... 427/523, 524, 427/526; 118/719, 723 R, 723 FI, 733; 250/283, 284, 289, 309, 441.11, 442.11, 443.11, 400, 423 F, 397, 432 R, 492.3, 492.21; 204/298.04; 315/111.81, 111.91

[56] References Cited

U.S. PATENT DOCUMENTS

| | | |
|---|---|---|
| 4,274,004 | 6/1981 | Kanai . |
| 4,595,831 | 6/1986 | Hetherington, Jr. et al. .......... 250/281 |
| 4,596,687 | 6/1986 | Dagenhart ............................ 250/396 R |
| 4,703,256 | 10/1987 | Hayafuji ................................. 324/71.3 |
| 4,724,324 | 2/1988 | Liebert .................................... 250/397 |
| 4,806,769 | 2/1989 | Mori et al. . |
| 5,053,627 | 10/1991 | Ruffell et al. ........................ 250/492.2 |
| 5,096,536 | 3/1992 | Cathey, Jr. . |
| 5,118,936 | 6/1992 | Purser ..................................... 250/281 |
| 5,134,299 | 7/1992 | Denholm ............................... 250/492.2 |
| 5,164,596 | 11/1992 | Noguchi .................................... 250/309 |
| 5,319,212 | 6/1994 | Tokoro ................................. 250/492.21 |
| 5,343,047 | 8/1994 | Ono et al. ................................ 250/398 |
| 5,376,787 | 12/1994 | Smith ...................................... 250/281 |
| 5,382,895 | 1/1995 | Elmer et al. ............................ 250/397 |
| 5,420,415 | 5/1995 | Trueira ................................ 250/492.21 |
| 5,486,702 | 1/1996 | O'Connor et al. .................. 250/492.21 |
| 5,497,006 | 3/1996 | Sferlazzo et al. .................... 250/423 R |
| 5,554,926 | 9/1996 | Elmer et al. ............................ 250/397 |
| 5,747,936 | 5/1998 | Harrison et al. .................... 315/111.81 |
| 5,834,787 | 11/1998 | Bunker ................................ 250/492.21 |
| 5,981,961 | 11/1999 | Edwards ............................. 250/492.21 |

FOREIGN PATENT DOCUMENTS 0 217 616 A2  4/1987  European Pat. Off. .
0 448 307 A2  6/1992  European Pat. Off. .

OTHER PUBLICATIONS

Patent Abstract of Japan—Pub# JP4043542, Pub. date Feb. 13, 1992 vol. 16, No. 230 E–1208.
Patent Abstract of Japan—Pub# JP4051448; Pub. date Feb. 19, 1992 vol. 16, No. 240 E–1211.
Abstract of Japanese Pat. 59–165359(A), Pub. Sep. 18, 1984, vol.# 9, No. 15, E–219 Jan. 22, 1985.

Primary Examiner—Marianne Padgett
Attorney, Agent, or Firm—Boult Wade Tennant

[57] ABSTRACT

An ion beam absorbing apparatus for an ion implanter comprises an ion absorber for absorbing ions in an ion beam generated by the ion implanter, and support means for supporting the ion absorber and adapted for connection with the ion implanter, so that when so connected, the ion absorber can intercept the ion beam and absorb ions not intercepted by a target to be implanted with beam ions. The support means is further adapted for supporting the ion absorber in a plurality of different positions which can be selected so that respective different parts of the ion absorber intercept the ion beam.

25 Claims, 4 Drawing Sheets

BEAM STOP APPARATUS FOR AN ION IMPLANTER

This application claims the benefit under 35 U.S.C. §371 of prior PCT International Application No. PCT/GB95/01309 which has an International filing date of Jun. 7, 1995 which designated the United States of America, the entire contents of which are hereby incorporated by reference.

FIELD OF THE INVENTION

This invention relates to ion implanters for implanting ions from an ion beam into semiconductor wafers, and in particular but not limited to ion implanters capable of implanting ions of more than one specie.

DESCRIPTION OF THE PRIOR ART

In ion beam implantation, an ion beam containing dopant ions is generated and directed toward the surface of a semiconductor wafer to dope the wafer in selected regions defined, for example, by a mask. A known ion implanter, as exemplified in U.S. Pat. No. 4,847,504 to Aitken et al, incorporated herein by reference, comprises an ion beam generator for generating a single beam of ions and which can be controlled so that the specie of ions transported by the beam can be selected. A rotatable support is provided for carrying a plurality of semiconductor wafers, comprising a rotatable hub having spokes extending radially therefrom with the end of each spoke adapted to carry an individual wafer. During ion implantation, the support is rotated at high speed and moved laterally relative to the beam line so that the wafers intercept the beam and become implanted with beam ions. A beam stop for trapping the ion beam during periods when the beam is not implanting wafers or for trapping beam ions which pass the wafers during an implant process is positioned in the beam line, downstream of the wafer support assembly. Typically, the beam stop is used to detect the beam current in dosimetry measurements and during beam tuning.

The continuous goal of reducing device size places higher and higher demands on the accuracy to which the various fabrication processes must be controlled. In ion implantation, it is important to be able to control both the dopant level and depth of implant into the semiconductor wafer with an increasing degree of precision.

It is an object of the present invention to provide a means of improving the quality of ion implant processes.

SUMMARY OF THE INVENTION

According to the present invention, there is provided an ion beam absorbing apparatus for an ion implanter, comprising an ion absorber for absorbing ions in an ion beam generated by said ion implanter, and support means for supporting said ion absorber and adapted for connection with said ion implanter so that, when so connected, said ion absorber can intercept said ion beam and absorb ions not intercepted by a target to be implanted with beam ions, wherein said support means is further adapted for supporting said ion absorber in a plurality of different positions which can be selected so that respective different parts of said ion absorber intercept said beam.

The term "ion absorber" means any device which is suitable for trapping or absorbing ions and includes for example, what are commonly termed in the art as beam stops, beam dumps and Faraday cups or buckets and is to be distinguished from the target or targets, e.g., semiconductor wafers, which are to be implanted with ions.

Also according to the present invention, there is provided a method of operating an ion implanter for implanting ions into a target, comprising implanting ions into at least one target, receiving ions which pass said target on an ion absorber and changing the position of said ion absorber in said ion implanter.

Also according to the present invention, there is provided a method of implanting ions into a target comprising implanting a first predetermined specie of ions into a target, receiving ions which pass said target on an ion absorber and removing ions of said first predetermined specie from said ion absorber before receiving on said ion absorber a specie of ions different to said first predetermined specie of ions.

Also according to the present invention, there is provided a method of implanting ions into a target comprising implanting a first predetermined specie of ions into a target, receiving ions which pass said target on an ion absorber, and replacing said ion absorber with another whose ion absorbing surface is substantially free of ions of said first predetermined specie, before implanting a specie of ions different to said first predetermined specie into a target.

The inventors have found that when an ion implanter is used first to implant one particular specie of ions, for example boron, and is then used to implant another different specie of ions, for example arsenic, the semiconductor wafers in which the subsequent specie of ions was implanted are contaminated with the previous specie of ions. It has been found that device performance can be compromised if the levels of contamination collect in sensitive regions of that device. One such sensitive region is the lightly doped surface layer between the source and drain of a field effect transistor. Boron contamination in this region has been found to cause significant threshold voltage shift. It has been further discovered by the inventors, that contamination of a wafer by a previously used specie of ions, which will be referred to as cross-contamination, can be reduced significantly by either cleaning the beam stop or replacing it with a clean beam stop before implanting ions of a different specie.

The ion beam absorbing apparatus of the present invention allows the ion absorber to be selectively positioned relative to the beam line so that respective selected parts of the ion absorber may be used to absorb only one particular specie of ions, thereby eliminating a major cause of cross-contamination, and greatly improving the quality and accuracy of the implant process.

In a preferred embodiment of the ion beam absorbing apparatus, the ion absorber comprises a support member and an ion absorbing layer mounted thereon for absorbing the beam ions. The ion absorbing layer may comprise a single unitary sheet of material, with specific areas of the sheet designated to absorb a particular specie of ions.

In another embodiment, the ion absorbing layer comprises a plurality of discrete ion absorbing plates. This embodiment provides the opportunity of enabling individual plates to be replaced as and when required. Preferably, the plates are arranged on a support member so that individual plates do not touch each other. Advantageously, this arrangement assists in minimising the heat transferred from the "active" region of the ion absorber during an ion implant, to other "dormant" regions of the ion absorber dedicated to receive and absorb different species of ions. Thermal isolation between different regions of the ion absorber, each dedicated to a particular specie of ions, minimises evaporation of ions from the regions not currently in use, and so reduces further the possibility of contamination.

Preferably, the plates are arranged so that only one plate is permitted to intercept the beam at a given time. The plates may each be sized so as to be greater than or substantially equal to the cross-sectional geometry and area of the ion beam at the surface of the plate so that the plate is of a sufficient size to intercept and absorb the whole ion beam without contaminating the neighbouring plate(s). Alternatively, the plates may be positioned sufficiently far apart so that the ion beam is intercepted by only one plate at a time.

Preferably, the support member is relatively thin and may be in the form of a plate so as to minimise the dimension of the apparatus in the direction of the beam line.

During an implant process, the ion absorber may be heated appreciably by the ion beam. In this case it would be desirable to cool the ion absorber. In one embodiment, the ion absorber has a first internal is channel formed therein for the passage of fluid and a second internal channel formed between the first internal channel and an external surface portion of the ion absorber for receiving fluid which may leak from the first internal channel towards the external surface portion. The ion absorber may comprise a plurality of parts, at least two of which are adapted such that when joined together form the first internal channel therebetween, and wherein the second internal channel is arranged to receive the fluid which may leak from the first internal channel through the joint formed between the parts which form the first internal channel. Advantageously, this arrangement allows the ion absorber to be cooled by circulating a coolant therethrough while minimising the risk of the coolant leaking from the ion absorber into the surroundings which may be under vacuum. Any fluid which may leak towards the external surface of the ion absorber is intercepted by the isolation channel from which it may be drained. The second channel may conveniently be vented to atmosphere.

Preferably, the ion absorber is rotatably supported by the support means, and in a preferred embodiment, the ion absorber includes a substantially planar surface for intercepting the ion beam and the support means is arranged to allow the planar surface to rotate substantially in the plane thereof. Advantageously, this rotational arrangement allows the apparatus to be extremely compact. Beneficially, this not only saves space, but also minimises the amount of lead shielding required for protection against X-rays. Preferably, the support means is adapted to allow the ion absorber to rotate about an axis displaced externally of the periphery of the beam cross-sectional area at the planar surface, so that an entirely different surface can be selected to receive the ion beam as the surface is rotated.

In a preferred embodiment, the apparatus comprises an enclosure adapted for sealing with an ion implanter, and coupling means couplable to the ion absorber to enable the position of the ion absorber to be changed from outside the enclosure. Advantageously, this arrangement allows the position of the ion absorber and therefore the part of the ion absorber used to receive a particular specie of ions to be changed without breaking vacuum within the enclosure, so that the ion implanter can be run continuously for various different species of ions. Conveniently, the coupling means may also have the function of supporting the ion absorber.

If the ion absorber is adapted to be cooled by passing a coolant therethrough, the coupling means may conveniently be adapted to carry the cooling fluid from outside the vacuum enclosure into the ion absorber. If the ion absorber has an isolation region formed therein for receiving coolant which may leak towards an external surface portion of the ion absorber, the coupling means may be adapted to allow leaked fluid to be withdrawn therethrough from the isolation region.

In a preferred embodiment, the apparatus includes a screen facing a beam absorbing surface of the ion absorber when the surface is not positioned to intercept the beam. Advantageously, the screen shields and isolates parts of the ion absorber, which are not being used in a particular implant, from the wafers which are being implanted with a particular specie of ions.

According to another aspect of the present invention there is provided an element for controlling the temperature of a body within a vacuum enclosure, comprising a plurality of parts, at least two of which are adapted such that when joined together form a first internal channel within said element, an inlet and an outlet port for allowing fluid to pass into and out of said element through said first channel, and a second internal channel, separate from said first internal channel, formed between said first internal channel and an external surface portion of said element and arranged to receive fluid which may leak from said first internal channel through the joint between the parts which form said first internal channel.

The element provides a simply formed, self contained fluid carrying vessel which may be placed directly in a vacuum chamber, with minimum risk of fluid leaking from the vessel into vacuum. The second channel effectively provides a space between the fluid carrying channel and the external surface of the element without requiring the overall size of the element to be substantially increased. If the joint in the wall of the fluid carrying channel fails, fluid is received by the second or isolation channel from which it may be drained, and fluid is thereby prevented from leaking into the vacuum chamber.

In one embodiment, at least one of the parts of the element which form the first internal channel comprises a plate and the second internal channel is disposed adjacent the peripheral edge of the plate. Preferably, the second internal channel is formed as a closed circuit.

In a preferred embodiment, the element further comprises an outlet port for allowing leaked fluid to be withdrawn from the second internal channel.

The element may further include support means for enabling the position of the element to be changed. The support means may comprise a support member which is adapted to carry fluid to and from the element and may also be adapted to carry leaked fluid away from the second internal channel.

The element may conveniently be adapted to support a body whose temperature is to be controlled. For example, the element may be formed as a support member for carrying one or more ion absorbing plates for use as a beam stop in an ion implanter. Alternatively, the element may be suitably formed to contact the surfaces of one or more bodies within a vacuum chamber to selectively control the temperature or temperatures thereof.

BRIEF DESCRIPTION OF THE DRAWINGS

Examples of embodiments of the present invention will now be described with reference to the drawings, in which.

DESCRIPTION OF PREFERRED EMBODIMENTS

Figure 1:
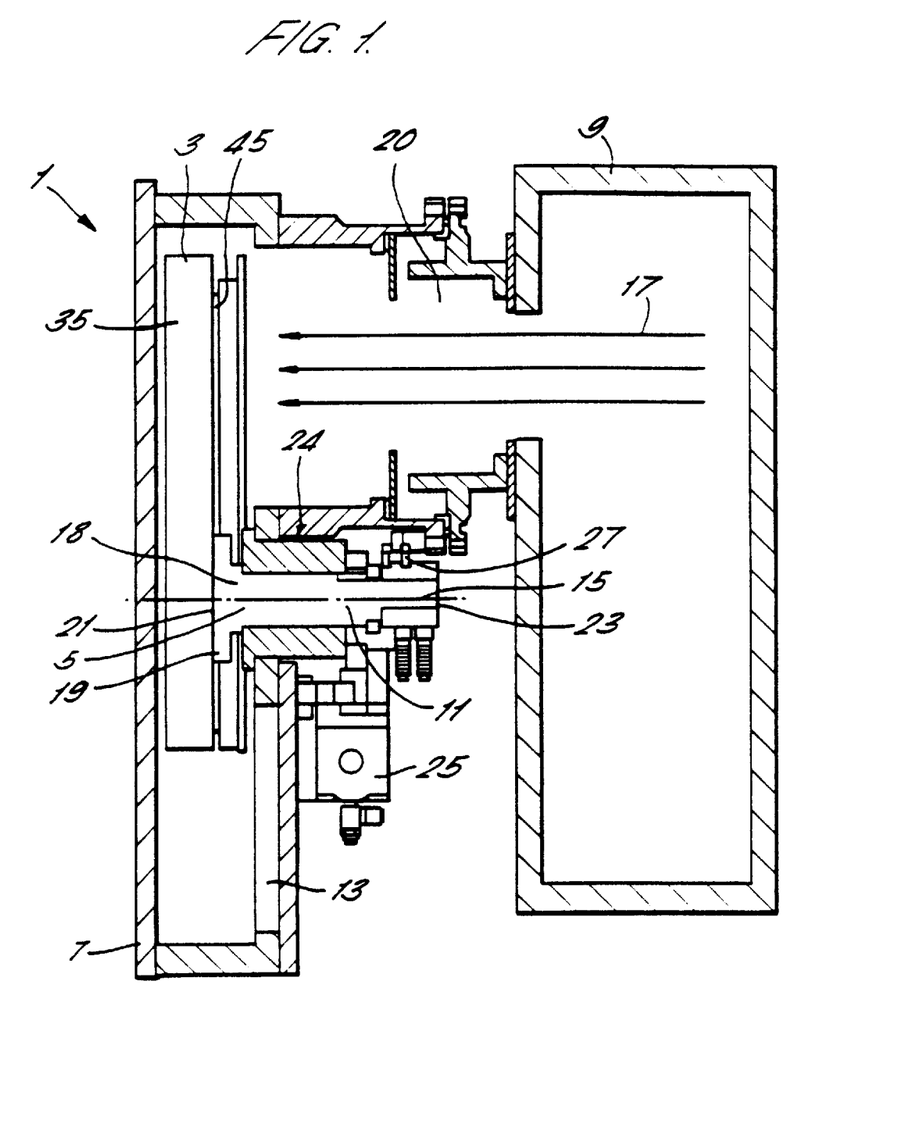
FIG. 1 shows a side view of a beam stop apparatus according to one embodiment of the present invention, connected to the beam tube of an ion implanter.
Figure 2:
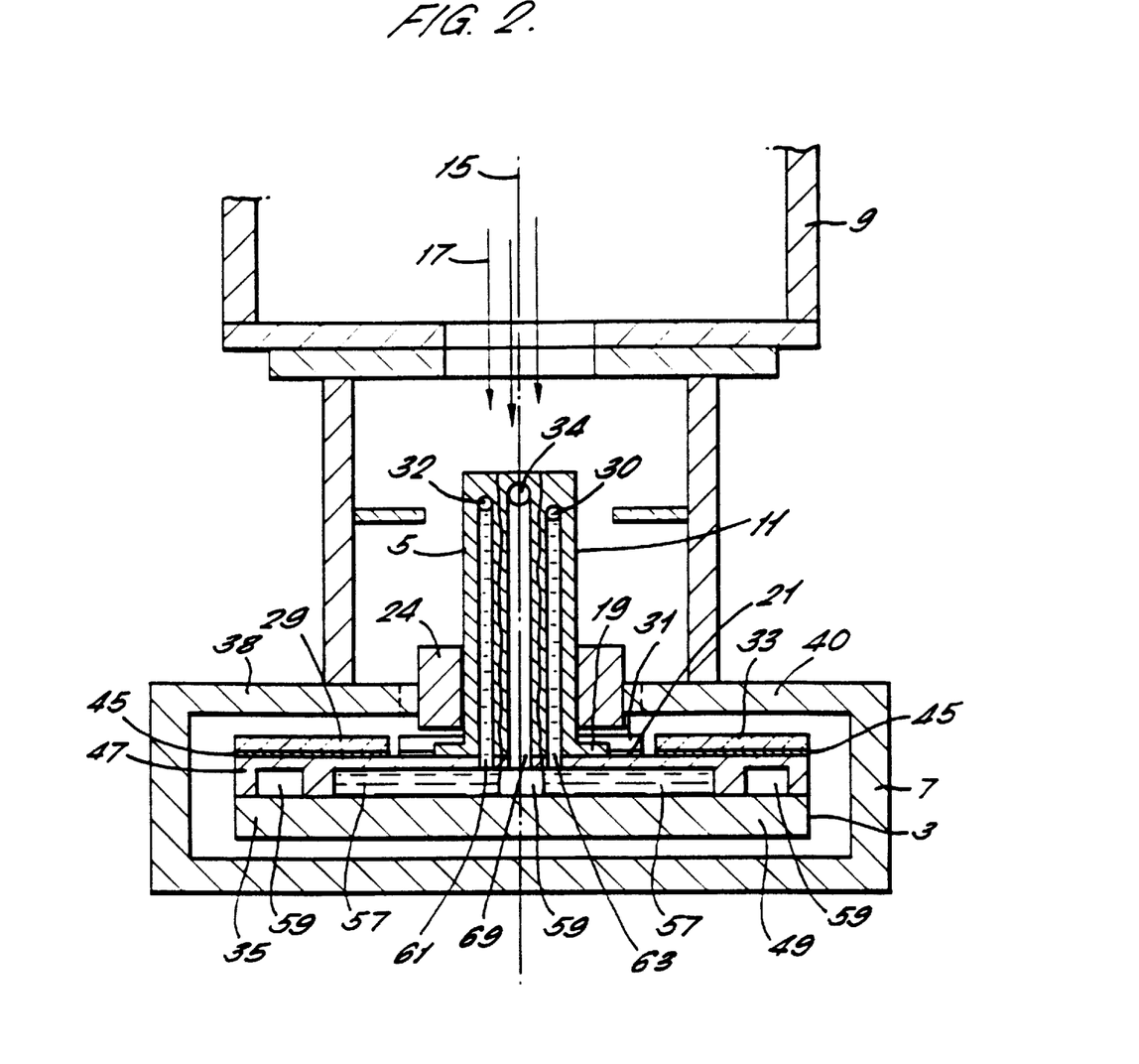
FIG. 2 shows a diagramatic section of the beam stop assembly shown in FIG. 1.

Referring to FIGS. 1 and 2, a beam stop assembly, generally indicated at 1, comprises a beam stop 3 and a rotary support member 5 on which the beam stop 3 is mounted. The beam stop 3 is housed in a vacuum tight enclosure 7 which is mounted on the front end of the beam tube 9 of a conventional ion implanter.

The rotary support member 5 comprises a shaft 11, which extends through the front wall 13 of the enclosure 7 and whose rotational axis 15 is generally parallel to the beam line 17. The end 18 of the shaft 11 which extends into the enclosure 7 is provided with a flange 19 to which the front face 21 of the beam stop 3 is fastened. The other end 23 of the shaft 11 is accessible from outside the enclosure 7 and has a gear wheel (not shown) coaxially mounted thereon which engages with a toothed rack (not shown) driven by a pneumatic actuator 25. A position sensor 27 is positioned near the outer end 23 of the shaft 11 and monitors the angular position of the shaft 11, and hence the position of the beam stop 5 within the enclosure 7. The rotary shaft 11 may be sealed with the wall of the enclosure by a ferrofluidic seal 24, which is particularly effective in sealing rotary joints under differential pressures.

In this embodiment, the walls of the enclosure 7 and all of the various components housed within the enclosure 7 are electrically connected together. The enclosure 7 and all components within the enclosure are electrically isolated from the beam tube and the enclosure serves as a Faraday bucket to collect all the beam ions which pass through the aperture 20 at the end of the beam tube. The beam current is measured by electrically connecting a suitable instrument, e.g. an ammeter, to an external part of the wall of the enclosure 7.

Figure 3:
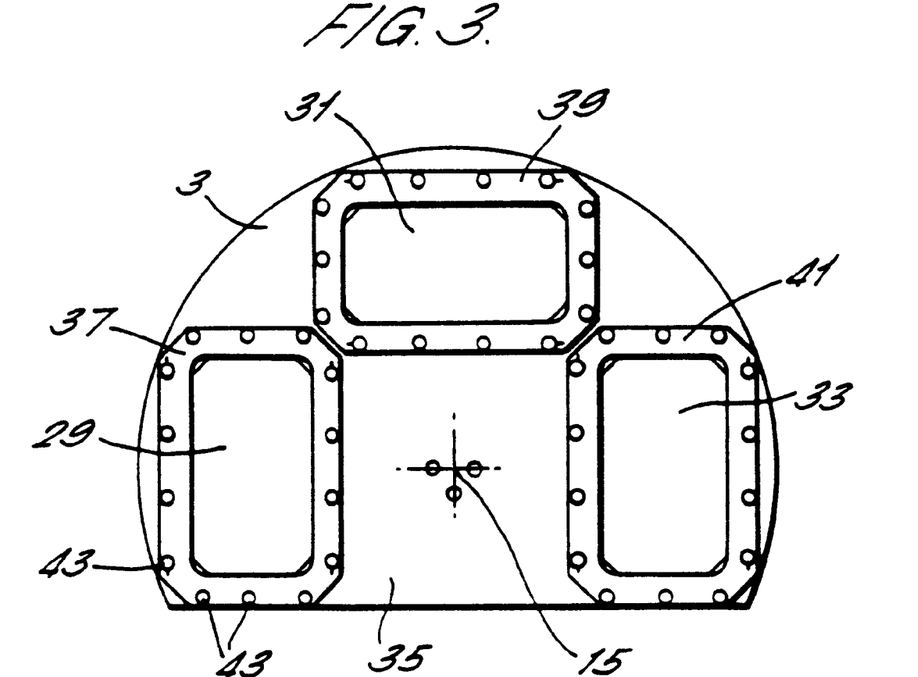
FIG. 3 shows a plan view of one embodiment of a beam stop shown in the assembly of FIGS. 1 and 2.

Referring to FIG. 3, the beam stop 3 comprises three rectangular graphite plates 29, 31 and 33 mounted on the face of a part circular support plate 35. The graphite plates 29, 31 and 33 are each spaced radially by the same distance from the rotational axis 15 of the support plate 35, and each graphite plate 29, 31 and 33 is positioned so as to be orthogonal to its adjacent plate. Each plate 29, 31 and 33 is held in position by means of a frame 37, 39 and 41 (typically made from aluminium) which locates into a shoulder (not shown) formed along the peripheral edge of each plate. The aluminium frames 37, 39 and 41 clamp the graphite plates is against the support plate 35 by screws 43 which pass through the frames into the support plate 35. A separate graphite layer (not shown) is positioned over the frames to screen the frames from beam ions. A gasket 45 (shown in FIG. 1) is placed between the support plate 35 and each graphite plate 29, 31 and 33 to absorb any unevenness in the surfaces thereof so that each plate is in good thermal contact with the support plate.

In this embodiment, the area of each graphite plate 29, 31 and 33 is sized to at least the cross-sectional area of the ion beam at the surface of the graphite plate, so that the surface of each graphite plate is capable of receiving all ions transported in the beam which enter the enclosure 7. On the other hand, the plates which are not being used during a particular ion implant are located behind a screen which shields these dormant plates both from the beam and other parts of the ion implanter upstream from the beam stop, including the semiconductor wafers. For example, as shown in the internal plan view in FIG. 2, the beam stop is oriented so that the middle graphite plate 31 is in position to receive ions in the ion beam, whereas both neighbouring plates 29 and 33 are located behind a respective screen 38, 40, which, in this embodiment, are each part of the front wall 13 of the enclosure 7.

In this particular embodiment, provision is made for cooling the graphite plates 29, 31 and 33 which can heat considerably, depending on the energy of the ion beam and the beam current. In this embodiment, cooling is achieved by circulating a suitable coolant within the support plate 35.

Referring to FIG. 3, the shaft 11 on which the beam stop is mounted has an inlet duct 30 and an outlet duct 32 formed therein for feeding coolant from outside the vacuum enclosure 7 into one or more cooling channels formed in the support plate 35. A further duct 34 is formed in the shaft 11 which communicates with a further channel which is formed within the support plate 35, between the cooling channel and the peripheral edge of the support plate. The purpose of this further channel is explained below. Modifying the shaft to feed coolant into and out of the support plate eliminates the need for additional pipework and associated further seals between the vacuum chamber 7 and atmosphere. Any suitable coolant e.g., a liquid such as water may be used. The support plate may form part of a closed circuit cooling system comprising an external pump and cooler. The pump feeds cool liquid into the support plate, the coolant absorbs heat as it passes through the cooling channel within the support plate and the hotter liquid is returned via the shaft 11 to the cooler. During an ion implant process, the graphite plate which is currently receiving the beam may heat to a temperature of about 250° C. By arranging the graphite plates so that there is good thermal isolation between them and by cooling the support plate, the temperature of the plates which are not in use can be maintained at the ambient temperature, i.e., about 25° C. Maintaining these other plates at the ambient temperature reduces the evaporation of absorbed ions from their respective surfaces, so reducing the risk of specie cross-contamination.

Figure 4:
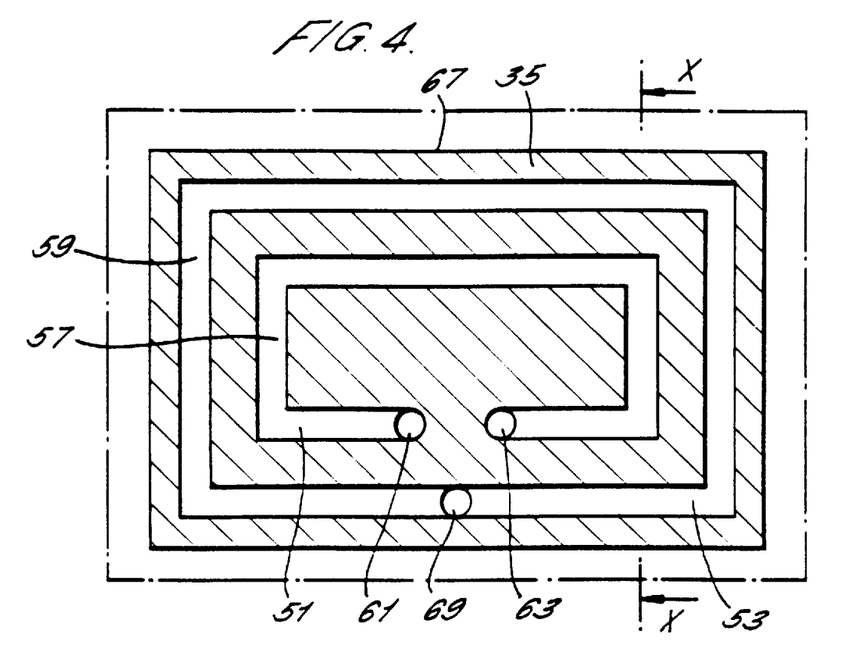
FIG. 4 shows a cross-section of a support member for use in an embodiment of the present invention, along the line Y—Y shown in FIG. 5.
Figure 5:
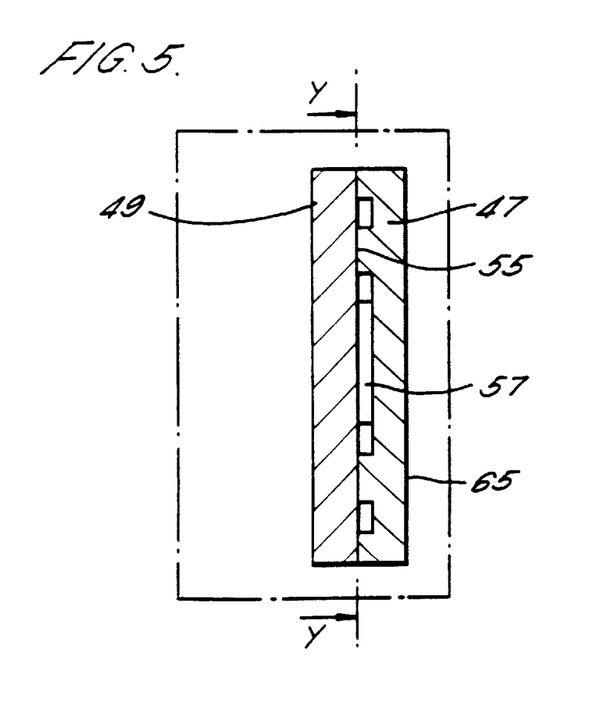
FIG. 5 shows a cross-section of the support member shown in FIG. 4, along the line X—X.

Turning to FIGS. 4 and 5, the support plate 35 comprises two separate parts, a front plate 47 and a back plate 49, which are joined together. Two discrete grooves 51 and 53 are formed in the inside face 55 of the front plate 47, so that when the front plate 47 and back plate 49 are joined together, two discrete internal channels or passageways 57, 59 are formed. One of the channels 57 is provided for coolant to circulate within and around the support plate 35 to draw heat away from the graphite plates which is conducted through the support plate 35. An inlet port 61 is formed in the front plate 47 to allow coolant to enter the passage 57 from the front face 65 of the front plate 47. An outlet port 63 is also formed in the front plate 47, adjacent the inlet port 61 to allow coolant to flow out of the passageway 57, and again through the front face 65 of the front plate 47. Both inlet and outlet ports are positioned so as to register with the ducts 30, 32 formed in the rotary shaft 11.

The other channel 59 is formed between the cooling channel 57 and the outer perimeter 67 of the support plate 35. The purpose of this channel 59 is to isolate the cooling channel 57 from outside the support plate 35 which in use is generally under vacuum. The isolation channel 59 is formed as a closed circuit or continuous loop which completely surrounds the cooling channel 57. A single inlet/outlet port 69 is provided to allow the isolation channel 59 to communicate through the front face 65 of the front plate 47. The inlet/outlet port 69 is positioned so as to register with the inlet/outlet duct 34 formed in the rotary shaft 11.

The front plate 47 and the back plate 49 may be joined together by any suitable means, e.g., by braising, welding, dip braising, vacuum braising, adhesives or friction welding, or by other techniques. If the joint between the front plate 47 and the back plate 49 should fail so that coolant flows through the joint towards the perimeter of the support plate 35, the coolant will collect in the isolation channel 59 from which it can be drained through the outlet port 69. In this way, coolant is prevented from leaking into the vacuum outside the beam stop, which would otherwise cause serious damage to the ion implanter and result in the implanter being unusable for a long period of time.

Operation of the beam stop during a typical ion implant process involving different species of ions will now be described with reference to FIGS. 1 to 3.

Firstly, one of the three graphite plates 29, 31, 33 is selected depending on the particular specie of ions to be implanted. The pneumatic actuator 25 is activated to rotate the beam stop, as necessary, so that the selected plate (left hand plate 29 in FIG. 2, say) is positioned to receive beam ions. The position sensor 27 monitors the angular position of the beam stop and may cause a control signal to be generated to deactivate the pneumatic actuator 25 when the selected plate is aligned with the beam path. The ion beam is then generated and directed at the selected plate and the ion beam is then tuned, as required by measuring the beam current from the Faraday bucket as described above. A plurality of semiconductor wafers 70 on a support or holder 71 are then sequentially introduced into the path of the ion beam and implanted with beam ions. Ions which pass the wafer target are intercepted and absorbed by the selected graphite plate 29.

Once the implant of the first selected specie of ions is complete, the ion beam is turned off or directed away from the graphite plate and a second specie of ions different to the first specie is selected for the next implant. The pneumatic actuator 25 is then activated to rotate the beam stop so that the plate (middle plate 31 say) dedicated to the second specie of ions is positioned to receive the beam. The ion beam is then redirected at the beam stop and beam ions are intercepted and absorbed by the plate 31 dedicated to receiving the second specie of ions. The beam is then tuned, using the second plate 31 to detect the beam current, as necessary. Semiconductor wafers are then introduced sequentially into the beam path and implanted with beam ions. Those beam ions which pass the wafers are absorbed on the second plate. Once the implant of that particular specie of ions is complete, the beam is again turned off or directed away from the beam stop and the beam generator is adjusted to generate a third specie of ions.

The pneumatic actuator 25 is activated to rotate the beam stop 3 so that the third plate 33 dedicated to the third specie of ions is positioned to receive the ion beam and the beam is then directed at the beam stop, whereby the ion beam is intercepted and absorbed by the third plate 33. The ion beam is then tuned using the third plate to detect the ion beam current, as necessary, and the third ion implant using the third specie of ions is then carried out.

In the above example, the ion beam is turned off or directed away from the beam stop before its position is changed to ensure that the ion beam carrying a particular specie of ions, does not impinge on other parts of the beam stop. The beam is only turned on again or redirected toward the beam stop once the ion beam has been changed to a new specie, and the beam stop has been correctly repositioned to receive the new specie of ions on that part of beam stop which is dedicated to the purpose.

In order to minimise cross-contamination, each graphite plate should be used only for one particular specie of ions, although some reduction in cross contamination can be gained in using for a particular specie of ions part of the ion absorber which has had limited exposure to a different specie of ions. The length of time a particular part of the beam stop has been exposed to a particular specie of ions could be recorded so that when the exposure time exceeds a predefined value, that part of the beam stop could be cleaned, by removing the absorbed specie of ions from the surface. Alternatively that part of the beam stop could be replaced by a replacement part which is free of implant ions.

Although in the above described embodiment, the beam stop comprises a beam absorbing layer mounted on a support member, the beam stop could be a single unitary member. Furthermore, although in the above described embodiment, the beam absorbing layer comprises a plurality of discrete plates, the beam absorbing layer may comprise a single unitary layer. Alternatively, the beam stop may comprise a plurality of discrete parts whose position can be varied independently of one another. Each part could be arranged to intercept the ion beam at a given time. For example, the beam stop may comprise a plurality of separate parts positioned one behind the other. When a particular part is required, for example to receive a predetermined specie of ions, any parts which are positioned in front of the selected part could be moved away to expose the selected part to the ion beam. In another embodiment, the beam stop apparatus may comprise an ion absorbing plate and a support member adapted to support the plate so that the plate can be fixed to the support member in a plurality of different positions relative to the support member.

Preferably, the number of designated ion absorbing regions, parts or plates is greater than or equal to the number of different species of ions used in the ion implanter.

In embodiments where the position of the beam stop is changed by rotation thereof, the beam stop may be rotated by any other suitable alternative to a pneumatic actuator, for example by an electric motor, or a hydraulic actuator.

Although rotation of the beam stop to expose different parts thereof to the ion beam is preferred because it allows the beam stop apparatus to be extremely compact, alternative ways of changing the position of the beam stop are also contemplated. For example, different parts of the beam stop may be brought into the beam path through linear movement of the beam stop. For example, the beam stop may have an elongate geometry and different parts of the beam stop along its length may be selected for receiving different species of beam ions.

Movement of the beam stop into different positions can be driven by any suitable arrangement capable of driving the beam stop from outside the vacuum enclosure. For example, the beam stop could be driven through bellows, through magnetic coupling, through sliding or rubbing or rotating 0-rings, through a multi-staged differentially pumped feed through, or it could be piezo driven.

The ion absorbing surface of the beam stop may comprise any suitable material, including graphite, graphite composite, aluminium, silicon carbide or refractory metals, as well as other materials.

It may also be beneficial to change the position of the beam stop so that beam ions are received on different parts thereof even when implanting with only one specie of ions. For example, when a particular part of the beam stop has been exposed to beam ions for a considerable period of time, it is possible that ions from the beam stop, in addition to ions originating in the ion beam generator, will be absorbed on the semiconductor wafers. Contamination of the semiconductor wafers by ions from the beam stop, even if they are the same ions currently being implanted, can lead to inaccuracies in the depth profile of the implanted ions and the implant dosage, i.e., the depth profile will be different and the dosage will be greater than that calculated from the ion beam current alone. Furthermore, because of the random nature of the contamination process in that the contamination levels vary from implant to implant and also across the width of the same semiconductor wafer, fluctuations in dosage may result. Thus, by limiting the exposure time of a particular part of the beam stop to the ion beam, contamination of the semiconductor wafers can be reduced and a more accurate ion implant process achieved.

In another embodiment, the beam stop may be controlled to move continuously during an implant process so that different parts of the beam stop are successively exposed to the ion beam. In this case, a part of the beam stop used to receive ions in a preceding implant may also be used to receive ions in the next succeeding implant. In other words there may be some overlapping of the beam from one region of the beam stop to the next.

Positioning and repositioning of the beam stop may be controlled by a computer. The computer could be programmed to change automatically the position of the beam stop in response to a change in the specie of implant ion. The computer could also record the total time a particular part of the beam stop has been exposed to the ion beam.

The beam stop apparatus may be used with any form of ion implanter including low beam energy implanters in which the beam is scanned over a stationary target.

Although the fluid cooled support plate 35 particularly shown in FIGS. 4 and 5 has been described with reference to ion implantation, the concept of an element having an internal fluid carrying channel formed by two parts of the element when joined together and a further channel formed to receive fluid which may leak towards an external surface portion of the element if the joint between the two parts fails has a broad application and in particular where it is desired to introduce fluid into a vacuum chamber to control the temperature of a body within the vacuum chamber. The external shape of the element is entirely arbitrary and may be chosen to suit a particular application. The fluid carrying channel which is formed in at least one of the parts of the element may have any configuration and cross-sectional area and geometry, and there may be more than one discrete fluid carrying channel. Similarly, the isolation channel which receives any leaked fluid may have any predetermined cross-sectional area or geometry. The fluid carrying channel may be formed by cutting a relief in either one of the parts of the element or in more than one of the parts. The internal channel may be formed of three parts of the element, wherein the middle part only is relieved to define the path of the channel with the other two parts placed either side to form a closed channel. The channel path may have any configuration, for example the channel may meander or zig-zag back and forth across the element or may be in the form of a spiral or may be generally circular and there may be several concentric channels which may be interlinked or completely separate.

Although the isolation channel shown in FIGS. 4 and 5 is formed in one of the parts which form the fluid carrying channel, this need not necessarily be the case. Separate additional parts may be used to form the isolation channel. However, it is important that the joint between the parts which form the fluid carrying channel(s) is shared with the wall of the isolation channel.

The element may be in the form of a ring or loop, in which case isolation channels may be formed around both the outside and inside of the ring or loop. The element may be adapted to support a body whose temperature is to be controlled, and used as a support member, the element may have application in semiconductor fabrication techniques such as etching and MOCVD ion implantation and other applications involving a beam or beams of accelerated particles, such as ion beam deposition and epitaxial growth, as well as other applications. The element may either be used for heating or cooling or alternatively the amount of fluid introduced into the element may be varied to increase the mass thereof for other applications. The element may be mounted on a moveable support within a vacuum chamber so that the position of the element can be changed.

Modifications to the above described embodiments will be apparent to those skilled in the art.

What is claimed is:

1. An ion implanter comprising an ion beam generator to generate a beam of ions for implantation in a substrate, a substrate holder for holding the substrate to be implanted whereby during implantation by the implanter the substrate on said holder at least partially and at least intermittently intercepts said beam, a beam stop including an ion absorber located behind said holder so as to absorb substantially all ions of said beam which are not intercepted by one of said holder and the substrate on said holder, said ion absorber having an ion absorbing surface which has a total area transverse to the beam which is greater than a cross-sectional area of the beam at the beam stop, and an adjustable support for the ion absorber for changing a position of said absorber relative to the beam to present different parts of said ion absorbing surface to the beam, such that each of said different parts can accommodate the cross-sectional area of the ion beam at the beam stop.

2. An ion implanter as claimed in claim 1, wherein said ion absorber comprises a support member and at least one ion absorbing member mounted thereon providing said ion absorbing surface.

3. An ion implanter as claimed in claim 2, wherein said at least one ion absorbing member comprises a plurality of discrete ion absorbing plates.

4. An ion implanter as claimed in claim 3, wherein said plates are arranged on said support member so that at least two plates do not touch each other.

5. An ion implanter as claimed in claim 2, wherein said support member is a plate.

6. An ion implanter as claimed in claim 1, wherein said ion absorber is rotatably supported by said adjustable support.

7. An ion beam implanter as claimed in claim 6, wherein said adjustable support is arranged to allow said ion absorber to rotate substantially in a plane containing said ion absorbing surface.

8. An ion beam implanter as claimed in claim 3, wherein the support member is supported by said adjustable support for rotation about an axis and said plates are arranged around said axis so that each plate intercepts said ion beam as said support member is rotated.

9. An ion implanter as claimed in claim 1, comprising a vacuum enclosure containing said ion absorber, said adjustable support being arranged to enable the position of said ion absorber to be changed from outside said enclosure.

10. An ion implanter as claimed in claim 9, wherein said adjustable support includes a rotary vacuum seal.

11. An ion implanter as claimed in claim 1, including a screen facing parts of said ion absorbing surface of said ion absorber which are not positioned to intercept said beam.

12. An ion implanter as claimed in claim 1 wherein said ion absorber has a first internal channel formed therein for flow of cooling fluid therethrough and a second internal channel formed between said first internal channel and an external surface portion of said ion absorber for receiving any of said fluid flowing in said first channel which may leak from said first internal channel towards said external surface portion.

13. An ion implanter as claimed in claim 12, wherein said ion absorber comprises a plurality of pieces, at least two of which are adapted such that when joined together the pieces form said first internal channel therebetween and a joint, and wherein said second internal channel is arranged to receive said any of said fluid flowing in said first channel which may leak from said first internal channel through the joint formed between the pieces which form said first internal channel.

14. An ion beam implanter as claimed in claim 13, wherein at least one of the parts which forms said first internal channel comprises a plate and said second channel extends around a peripheral edge of said plate.

15. A method of operating an ion implanter, comprising implanting into at least one first targets ions of a first predetermined species and receiving ions of said first predetermined species which pass said first target for said first predetermined species, on a first absorbing surface part of an ion absorber, implanting ions of a second predetermined species different from said first predetermined species into at least one second target and receiving ions of said second predetermined species which pass said second target for said second predetermined species on a second absorbing surface part of said ion absorber different from said first part.

16. A method as claimed in claim 15, further comprising implanting ions of a third predetermined species into at least one third target and receiving ions of said third predetermined species which pass said third target on a third absorbing surface part of said ion absorber different from said first and second parts.

17. A method as claimed in claim 15, wherein at least one of the absorbing surface parts of said ion absorber on which a given predetermined species of ions was received is used only for receiving said given predetermined species of ions during at least one subsequent implant of said given predetermined species of ions.

18. A method as claimed in claim 15, wherein said ion absorber is moved so that no absorbing surface part of the ion absorber used to receive a given predetermined species of ions is used to receive a different predetermined species of ions.

19. A method as claimed in claim 15, wherein the ion absorber is moved between respective positions for said first and said second surface parts to receive respectively said ions of said first and said second predetermined species.

20. A method as claimed in claim 19, comprising preventing beam ions reaching said ion absorber while moving the ion absorber.

21. A method as claimed in claim 19, wherein said ion absorber is rotated to move the ion absorber between rotational positions.

22. A method as claimed in claim 15, further comprising measuring a length of time over which a predetermined specie of ions is received on a predetermined part of said ion absorber.

23. A method of operating an ion implanter comprising the steps of:

(a) generating a first beam comprising a first predetermined species of ions, (b) introducing into a path of said first beam a target to be implanted with said first species of ions in a chamber, (c) receiving, on a first ion absorbing surface, beam ions of said first species which pass said target to be implanted with said first species of ions, and thereafter (d) generating a second beam comprising a second species of ions different from said first species, (e) in the chamber, introducing into a path of said second beam a target to be implanted with said second species of ions wherein the second beam path is the same as the first beam path within the chamber, and (f) receiving, on a second ion absorbing surface different from said first beam absorbing surface, beam ions of said second species which pass said target to be implanted with said second species of ions.

24. A method as claimed in claim 23, comprising the step of using the beam absorbing surface on which a given species of ions was received only for receiving the same given species of ions during at least one subsequent ion implant process.

25. A method as claimed in claim 23, comprising the step of rotating said ion beam absorbing surface from a first position in which said first species of ions are received to a second position in which said second species of ions are received.

* * * * *